US 6,627,542 B1

(12) United States Patent
Gandikota et al.

(10) Patent No.: US 6,627,542 B1
(45) Date of Patent: Sep. 30, 2003

(54) CONTINUOUS, NON-AGGLOMERATED ADHESION OF A SEED LAYER TO A BARRIER LAYER

(75) Inventors: Srinivas Gandikota, Santa Clara, CA (US); Rong Tao, San Jose, CA (US); Liang-Yuh Chen, Foster City, CA (US); Seshadri Ramaswami, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 2 days.

(21) Appl. No.: 09/604,858

(22) Filed: Jun. 27, 2000

Related U.S. Application Data
(60) Provisional application No. 60/143,363, filed on Jul. 12, 1999.

(51) Int. Cl.[7] ................................................ H01L 21/44
(52) U.S. Cl. ........................................ 438/654; 438/687
(58) Field of Search ................................. 438/653, 654, 438/656, 687, 685

(56) References Cited

U.S. PATENT DOCUMENTS

| 4,364,099 | A |   | 12/1982 | Koyama et al. | 361/305 |
|---|---|---|---|---|---|
| 4,649,625 | A |   | 3/1987 | Lu | 29/571 |
| 4,760,369 | A |   | 7/1988 | Tiku | 338/308 |
| 5,142,438 | A |   | 8/1992 | Reinberg et al. | 361/313 |
| 5,225,363 | A |   | 7/1993 | Riemenschneider et al. | 437/47 |
| 5,352,623 | A |   | 10/1994 | Kamiyama | 437/52 |
| 5,354,712 | A |   | 10/1994 | Ho et al. | 437/195 |
| 5,356,836 | A | * | 10/1994 | Chen et al. | 438/627 |
| 5,487,923 | A |   | 1/1996 | Min et al. | 427/569 |
| 5,508,221 | A |   | 4/1996 | Kamiyama | 437/60 |
| 5,523,259 | A | * | 6/1996 | Merchant et al. | 438/643 |
| 5,543,357 | A | * | 8/1996 | Yamada et al. | 438/643 |
| 5,563,090 | A |   | 10/1996 | Lee et al. | 437/60 |
| 5,614,437 | A |   | 3/1997 | Choudhury | 437/140 |
| 5,633,200 | A |   | 5/1997 | Hu | 438/653 |
| 5,677,238 | A | * | 10/1997 | Gn et al. | 438/643 |
| 5,717,628 | A |   | 2/1998 | Hammerl et al. | 365/149 |
| 5,877,087 | A | * | 3/1999 | Mosely et al. | 438/656 |
| 5,897,369 | A |   | 4/1999 | Jun | 438/629 |
| 5,913,147 | A | * | 6/1999 | Dubin et al. | 438/687 |
| 5,933,758 | A | * | 8/1999 | Jain | 438/687 |
| 5,948,553 | A | * | 9/1999 | Kamijo | 428/692 |
| 5,981,382 | A | * | 11/1999 | Konecni et al. | 438/646 |
| 6,037,258 | A | * | 3/2000 | Liu et al. | 438/687 |
| 6,069,068 | A | * | 5/2000 | Rathore et al. | 438/628 |
| 6,140,228 | A | * | 10/2000 | Shan et al. | 204/192.17 |
| 6,140,236 | A | * | 10/2000 | Restaino et al. | 438/622 |
| 6,184,137 | B1 | * | 2/2001 | Ding et al. | 438/687 |
| 6,187,670 | B1 | * | 2/2001 | Brown et al. | 438/638 |
| 6,197,688 | B1 | * | 3/2001 | Simpson | 438/678 |
| 6,221,765 | B1 | * | 4/2001 | Ueno | 438/653 |
| 6,440,841 | B2 | * | 8/2002 | Wang et al. | 438/629 |

* cited by examiner

Primary Examiner—John F. Niebling
Assistant Examiner—Angel Roman
(74) Attorney, Agent, or Firm—Moser, Patterson & Sheridan, LLP

(57) ABSTRACT

A method and apparatus is provided for improving adherence of metal seed layers to barrier layers in electrochemical deposition techniques. The method includes depositing an adhesion layer continuously or semi-continuously without agglomeration onto a barrier layer prior to depositing a seed layer by controlling the substrate temperature, the chamber pressure, and/or the power delivered to a deposition chamber. Deposition of the adhesion layer prevents layer delamination which leads to agglomeration of the deposited layers and formation of voids in the high aspect ratio features.

42 Claims, 4 Drawing Sheets

CONTINUOUS, NON-AGGLOMERATED ADHESION OF A SEED LAYER TO A BARRIER LAYER

This application claims the benefit of provisional application Ser. No. 60/143,363 filed Jul. 12, 1999.

BACKGROUND OF THE INVENTION

1. Field of the Invention

The present invention relates to a metallization process for manufacturing semiconductor devices. More particularly, the invention relates to a method for adhering metal layers to barrier layers.

2. Background of the Related Art

Consistent and fairly predictable improvement in integrated circuit design and fabrication has been observed in the last decade. One key to successful improvements is the multilevel interconnect technology, which provides the conductive paths between the devices of an integrated circuit (IC) device. The shrinking dimensions of features, presently in the sub-quarter micron and smaller range, such as horizontal interconnects (typically referred to as lines) and vertical interconnects (typically referred to as contacts or vias) in very large scale integration (VLSI) and ultra large scale integration (ULSI) technology, has increased the importance of metal layer deposition and post deposition treatment techniques of metal layers.

The multilevel interconnects that lie at the heart of ultra large scale integration (ULSI) technology require planarization of interconnect features formed in high aspect ratio apertures, including the horizontal and vertical interconnects, and other features. Reliable formation of these interconnects and features is very important to the success of ULSI and to the continued effort to increase circuit density and quality on individual substrates and die. As circuit densities increase, the widths of the instruments and other features, as well as the dielectric materials between them, decrease to less than 0.25 $\mu$m, whereas the thickness of the dielectric layers remains substantially constant, with the result that the aspect ratios for the features, ie., their height divided by width, increases.

Many traditional deposition processes, such as physical vapor deposition (PVD) and chemical vapor deposition (CVD), have difficulty filling structures where the aspect ratio exceed 4:1, and particularly where it exceeds 10:1. Therefore, there is a great amount of ongoing effort being directed at the formation of void-free, nanometer-sized features having high aspect ratios wherein the ratio of feature height to feature width can be 4:1 or higher. Additionally, as the feature widths decrease, the device current remains constant or increases, which results in an increased current density in the feature.

Copper and its alloys are now being considered as an interconnect material in place of aluminum, because copper has a lower resistivity (1.7 $\mu\Omega$-cm compared to 3.1 $\mu\Omega$-cm for aluminum), higher electromigration resistance, and higher current carrying capacity. These characteristics are important for supporting the higher current densities experienced at high levels of integration and increase device speed. Additionally, copper also has good thermal conductivity and is available in a highly pure form. Therefore, copper is becoming a choice metal for filling sub-quarter micron, high aspect ratio interconnect features on semiconductor substrates.

Despite the desirability of using copper for semiconductor device fabrication, choices of fabrication methods for depositing copper into very high aspect ratio features (e.g.=4:1 aspect or 0.25$\mu$ or less size) are limited. In the past, chemical vapor deposition (CVD) and physical vapor deposition (PVD) techniques were the preferred processes for depositing electrically conductive material, typically aluminum, into the contacts, vias, lines, or other features formed on the substrate. However, for copper applications, precursors for CVD copper processes are still being developed, and PVD copper deposition into high aspect ratio features has produced unsatisfactory results because of voids formed in the features. For instance, PVD copper tends to bridge the opening to small features resulting in non-conformal large deposits on the substrate which typically includes voids in the vias and interconnects. As a result of the process limitations of CVD and PVD techniques, electroplating, which had previously been limited to the circuit board fabrication, is being used to fill vias and contacts on semiconductor devices. Thus, efforts are being explored to improve electroplating and other similar processes for use in substrate manufacturing especially in applications with high aspect ratio features.

Metal electroplating is generally known and can be achieved by a variety of techniques. A typical copper electroplating deposition method generally comprises physical vapor depositing a barrier layer over the surface of a substrate having various features formed thereon, chemical vapor depositing or physical vapor depositing a conductive metal seed layer, preferably copper, over the barrier layer, and then electroplating a conductive metal layer over the seed layer to fill the structure/feature.

Copper seed layers are preferably deposited by chemical vapor deposition (CVD) techniques rather than being deposited by physical vapor deposition (PVD) techniques. Although PVD techniques are relatively inexpensive and can provide conformal coverage over a field (the upper or outer most surface of the substrate), however, these same techniques are not well suited for covering the sidewalls, particularly the top corner of the sidewalls, and floor surfaces of high aspect ratio interconnects and other features. This less than desirable coverage results in low resistance to chemical attack and to inter-layer metal diffusion. In contrast, CVD deposited films can provide excellent coverage of sidewalls and maintain a high degree of conformity to the lower surface of high aspect ratio structures.

One problem with the use of copper is that copper diffuses into silicon dioxide, silicon and other dielectric materials. Therefore, conformal barrier layers become increasingly important to prevent copper from diffusing into the dielectric and compromising the integrity of the device. However, due to reliability issues of electromigration resistance and void formation, adhesion between copper and the underlying barrier layer is a major concern in proposed multilevel metallization schemes. With typical copper barrier layers now available, CVD copper has less than desirable adhesion to the barrier layers and has a tendency to delaminate from the sidewalls which leads to agglomeration of the copper layer and formation of voids in the high aspect ratio interconnects.

Therefore there remains a need to develop a metallization process with improved adhesion between barrier layers and subsequently deposited metal layers. Ideally, the improved adhesion method should promote adhesion between refractory metals used as barrier materials and conducting metals, such as copper, used in filling high aspect ratio features.

SUMMARY OF THE INVENTION

The invention generally provides a method of improving adhesion of metal layers deposited using chemical vapor deposition or electrochemical deposition techniques to barrier layers. In one aspect of the invention, the deposition process comprises depositing an adhesion layer on a barrier layer formed on the substrate and depositing a metal seed layer on the adhesion layer. The adhesion layer is deposited under conditions, such as reduced substrate temperature, or increased pressure, that minimize agglomeration and form a continuous layer for subsequent void-free filling of features, such as interconnects, on the substrate.

Preferably the adhesion layer comprises copper, platinum, gold, molybdenum, tungsten, nickel, and combinations thereof, deposited by physical vapor deposition at a pressure between about 10 mTorr and about 60 mTorr on a substrate maintained at a temperature below about 300° C. Deposition of the adhesion layer preferably occurs at reduced power levels and reduced bias levels to reduce heating of the substrate. A metal seed layer is then deposited on the adhesion layer by chemical vapor deposition or electrochemical deposition prior to deposition of a metal fill layer.

In one embodiment, the barrier layer preferably comprises titanium, titanium nitride, tantalum, tantalum nitride, tungsten, tungsten nitride, and combinations thereof, and may be deposited by physical vapor deposition under conditions that minimize agglomeration and enhance formation of a continuous layer. The metallization process provides for stronger adhesion between refractory barrier layers and seed layers of conducting metals, such as copper, and reduces voids when filling high aspect ratios features.

In another aspect of the invention, a method is provided for processing a substrate by depositing a barrier layer on the substrate, depositing a metal adhesion layer on the barrier layer, and depositing a seed layer, such as copper, on the adhesion layer. The method may further comprise electroplating a conducting metal layer, such as copper, on the seed layer.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention will be described below in reference to a physical vapor deposition (PVD) process that can be carried out using process equipment, such as an Endura® platform, available from Applied Materials, Inc., located in Santa Clara, Calif. A similar staged-vacuum wafer processing system is disclosed in U.S. Pat. No. 5,186,718, entitled Staged-Vacuum Wafer Processing System and Method, Tepman et al., issued on Feb. 16, 1993, which is incorporated herein by reference to the extent not inconsistent with the invention.

The equipment preferably includes an integrated platform having an PVD chamber, such as a PVD "longthrow" chamber or PVD "standard" chamber, both commercially available from Applied Material Inc. of Santa Clara, Calif. It is to be understood that while the below described PVD chamber is known to the inventors, other chambers may also be used or modified to be used, to advantage to accomplish the methods of the present invention. The metal deposition process described herein is preferably carried out in a multichamber processing apparatus or cluster tool having a PVD chamber capable of being operated at a pressure below about 1.0 Torr.

Figure 1:
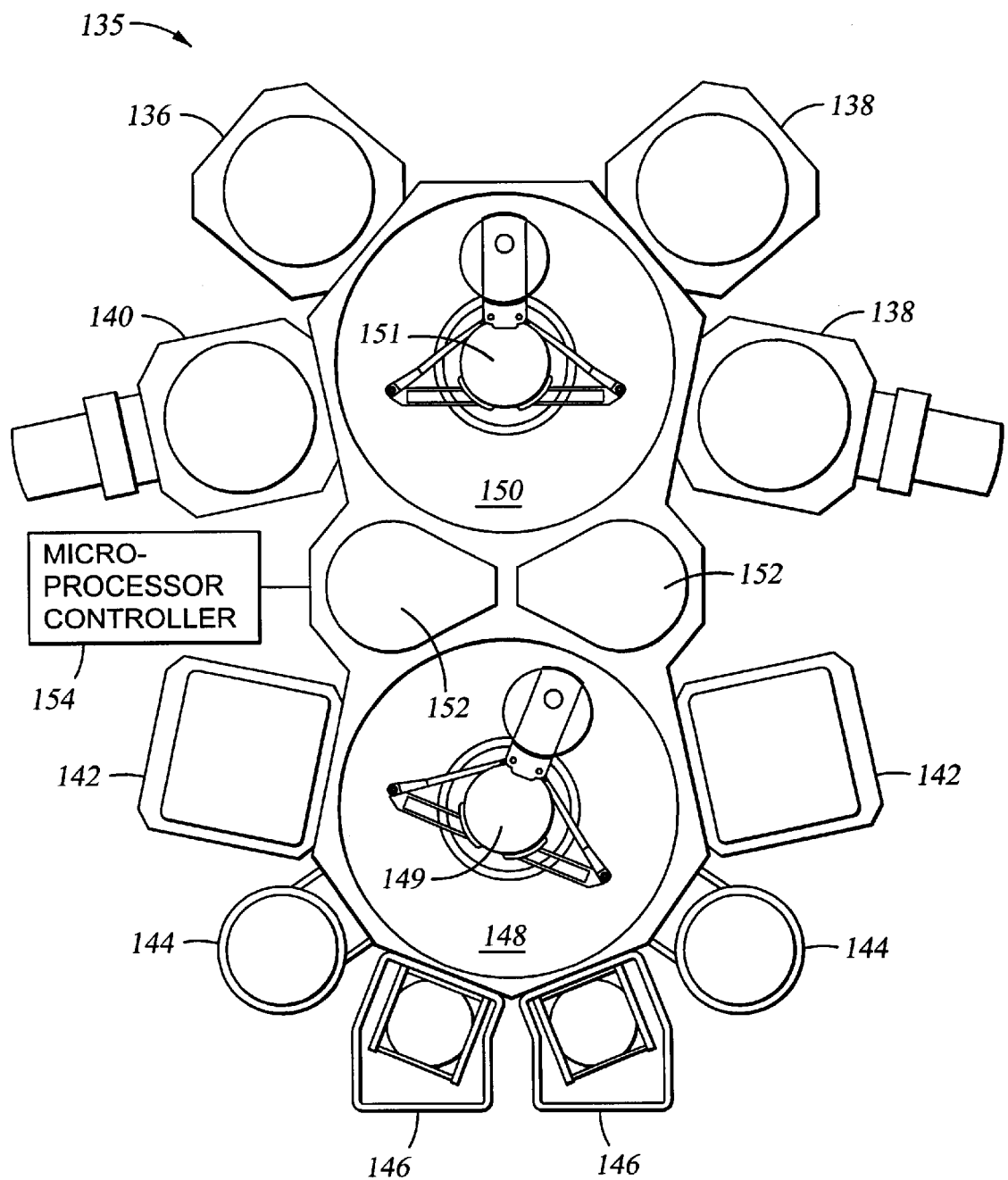
FIG. 1 is a schematic top view of an integrated multichamber apparatus suitable for depositing a barrier layer, a PVD adhesion layer, and a CVD metal seed layer on a semiconductor substrate via.

A schematic top view of a multichamber processing apparatus 135 suitable for performing the processes described herein is illustrated in FIG. 1. The particular embodiment of the apparatus 135 shown herein is suitable for processing planar substrates, such as semiconductor substrates, and is provided to illustrate the invention, and should not be used to limit the scope of the invention.

The apparatus 135 typically comprises a cluster of interconnected process chambers including at least one long throw PVD metal chamber. The apparatus 135 preferably includes a PVD Cu chamber 138 having a substrate to target spacing of at least 100 mm for depositing flash PVD Cu layers, and an additional PVD Cu chamber 138 for depositing a PVD copper seed layer if desired. Additionally, the apparatus may also comprise a copper CVD chamber 136 for depositing a CVD copper seed layer.

The apparatus 135 may further comprise a PVD Ta/TaN chamber 140 or another barrier layer chamber, two pre-clean chambers 142 for removing contaminants (such as PreClean II chambers available from Applied Materials), two degas chambers 144, and two load lock chambers 146. The apparatus 135 has two transfer chambers 148, 150 containing transfer robots 149, 151, and two cooldown chambers 152 separating the transfer chambers 148, 150. The apparatus 135 is automated by programming a microprocessor controller 154. However, the process could also be operated by individual chambers, or a combination of the above.

Figure 2:
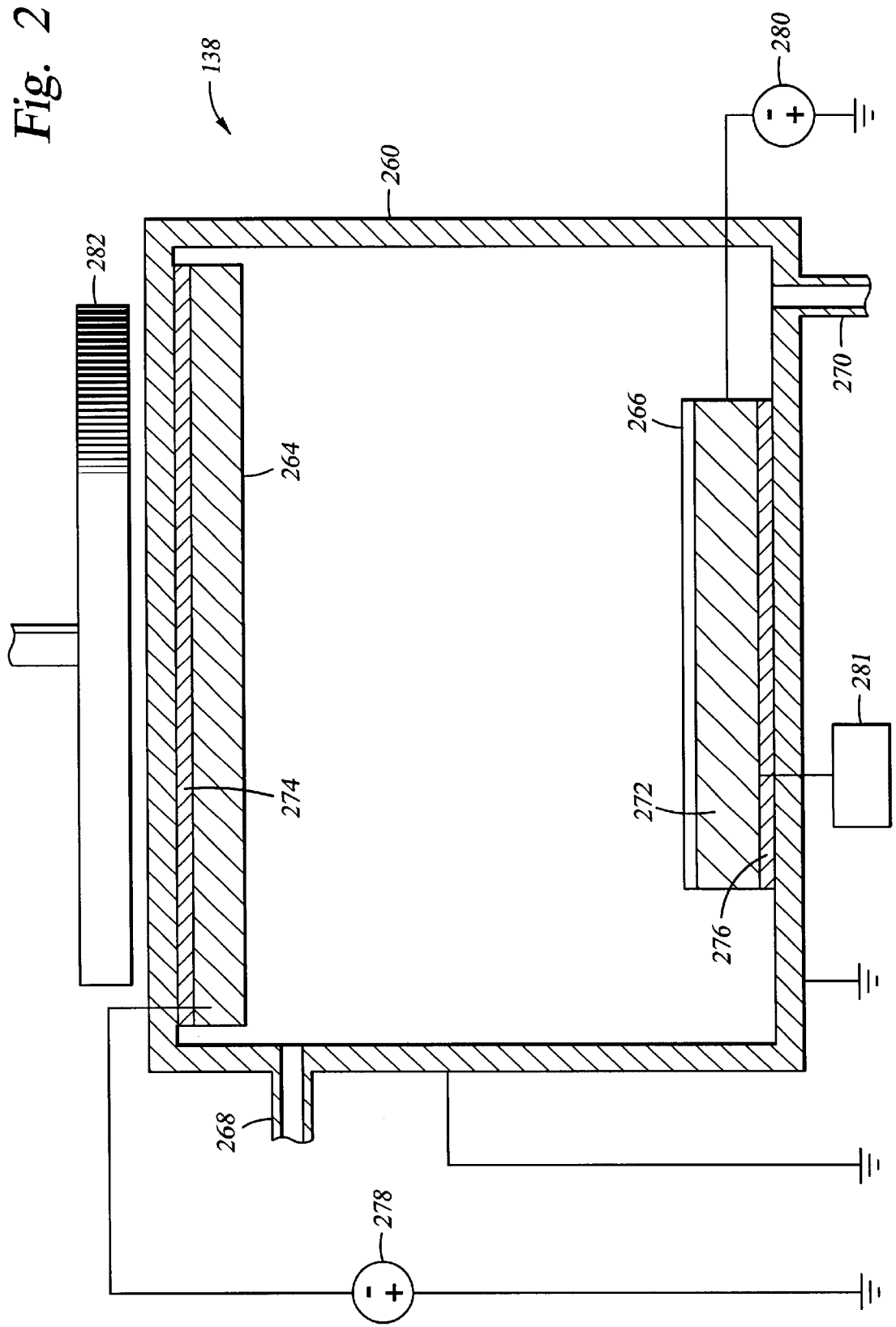
FIG. 2 is a schematic diagram of a PVD "long throw" chamber suitable for depositing the adhesion layer described herein.

FIG. 2 is a schematic cross-sectional view of an exemplary long throw PVD chamber 138 used to advantage in depositing the adhesion metal layer according to the processes described herein. A sputtering target 264 and a semiconductor substrate 266 are contained within a grounded enclosure wall 260, which may be a chamber wall as shown or a grounded shield. The target 264 and the substrate are separated by a long throw distance of at least about 100 mm, preferably from about 150 mm to about 190 mm. The long throw chamber may also contain a collimator (not shown) between the target 264 and the substrate 266 if needed to provide a more uniform and symmetrical flux of deposition material to each location on the substrate 266.

Referring still to FIG. 2, the chamber 138 generally includes at least one gas inlet 268 connected to a gas source (not shown) and an exhaust outlet 270 connected to an exhaust pump (not shown). A substrate support pedestal 272 is disposed at one end of the enclosure wall 260, and the sputtering target 264 is mounted to the other end of the enclosure wall 260. The target 264 is electrically isolated from the enclosure wall 260 by an insulator 274 so that a negative voltage may be applied and maintained on the target with respect to the grounded enclosure wall 260. The substrate support pedestal 272 is also electrically isolated from the enclosure wall 260 by an insulator 276, so that a positive voltage may be applied and maintained on the substrate and/or the support pedestal 272 with respect to the grounded enclosure wall 260. In operation, the substrate 266 is positioned on the support pedestal 272 and a plasma is generated in the chamber 238.

During the deposition process of the conformal PVD metal layer according to the present invention, a process gas comprising a non-reactive species such as Ar, is charged into the PVD chamber 138 through the gas inlet 268 at a selected flow rate regulated by a mass flow controller (not shown). The chamber pressure is controlled by varying the rate that process gases are pumped through the exhaust outlet 270 and is maintained between about 5 milliTorr and about 1 Torr to promote deposition of continuous PVD metal layers. A chamber pressure between about 10 milliTorr and about 60 milliTorr is preferably used.

A power source, such as a D.C. power supply 278, applies a negative voltage to the target 264 with respect to the enclosure wall 260 so as to excite the gas into a plasma state. Ions from the plasma bombard the target 264 and sputter atoms and larger particles of target material from the target 264. The particles sputtered from the target 264 travel along linear trajectories from the target 264, and a portion of the particles collide with, and deposit on, the substrate 266. A bias power source 280, supplies a bias to the support pedestal 272 to impart improved directionality of the ions as well as further attract ions to the substrate 266 to enhance deposition of material in structures formed on the substrate. A backside gas source 281 connected to the support pedestal 272 and provides a gas for flowing around the substrate 266 to provide a convective medium to cool the process gas during deposition of the adhesion layer.

A conventional magnetron sputtering source employs a rotating magnet 282 above the target 264 to trap electrons adjacent the target and thereby increase the concentration of plasma ions adjacent to the sputtering surface of the target 266. Rotation of the magnetron 282 during sputtering of the target 264 results in a radially symmetric target erosion profile.

Figure 3:
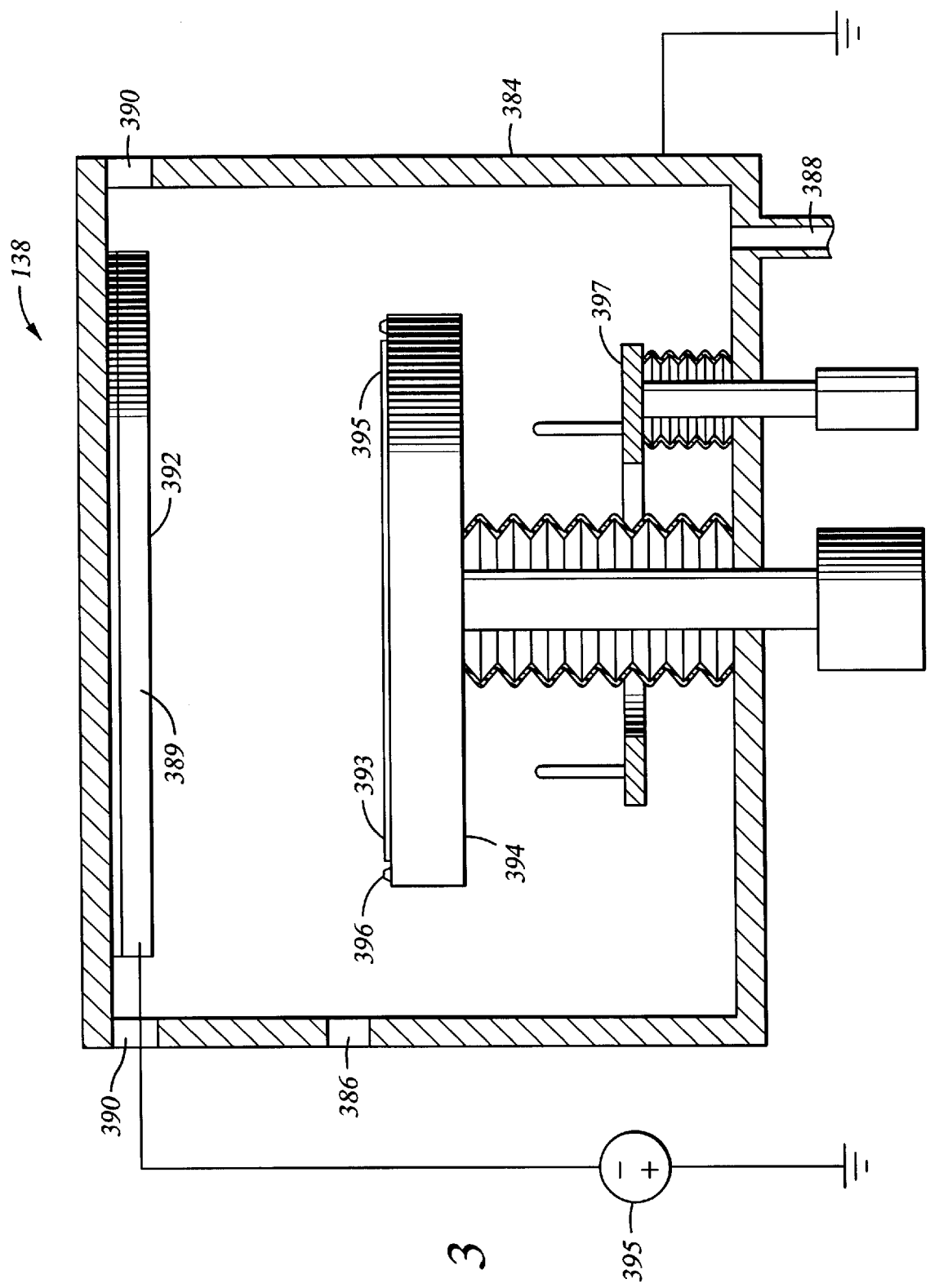
FIG. 3 is a schematic diagram of a PVD "standard" chamber suitable for depositing an adhesion layer described herein.

FIG. 3 is a schematic cross-sectional view of an alternative PVD chamber 138 suitable for performing a PVD deposition process of the present invention. The chamber 138 generally includes a grounded enclosure wall 384, having at least one gas inlet 386 and an exhaust outlet 388 connected to an exhaust pump (not shown). A PVD target 389 is isolated from the grounded enclosure wall 384 by an insulator 390. The PVD target 389 provides a sputtering surface 392 for depositing material on a substrate 393 positioned on a support member, such as a moveable pedestal 394. The pedestal 394 includes a generally planar surface 395 having positioning pins 396 for receiving the substrate 393 thereon. A negative voltage may be maintained on the target 389 with respect to the grounded enclosure wall 384 by a DC power source 395.

A lift pin mechanism 397 raises and lowers the substrate 393 with respect to the pedestal 394 while the pedestal is in a retracted position. The pedestal 394 extends to place the substrate 393 adjacent the target during deposition of metal layers such as aluminum. The pedestal 394 can be heated or cooled to control the substrate temperature. A backside gas source 381 connected to the support pedestal 372 provides for a gas flowing around the substrate 366 to provide a convective medium to cool the process gas during deposition of the adhesion layer.

In one embodiment, the invention provides improved adhesion between conformal barrier layers and seed layers by the physical vapor deposition of a continuous or semi-continuous adhesion layer of a PVD metal, also called a flash layer, on the barrier layer prior to depositing a seed layer on the adhesion layer. The barrier layer is first deposited to prevent the diffusion of conductive metals, such as copper, into adjacent dielectric materials which can detrimentally affect the electrical properties of adjacent materials, and in some instances cause electrical shorts to occur which can result in device failure. The metal seed layer promotes void-free filling of the via or substrate feature in conjunction with a further deposited conducting metal layer. The metal seed layer is typically copper deposited by CVD deposition techniques, or even electro-chemical deposition techniques.

Another embodiment of the invention provides for metallization of a substrate feature including the sequential steps of depositing a barrier layer on the substrate surface by conventional means known in the art, depositing a continuous or semi-continuous layer of a non-agglomerating metal, preferably copper, by PVD in an ionized PVD process, depositing a seed layer, preferably copper, in a CVD chamber to avoid the formation of voids, and electro-chemical depositing copper to fill the feature.

Figure 4:
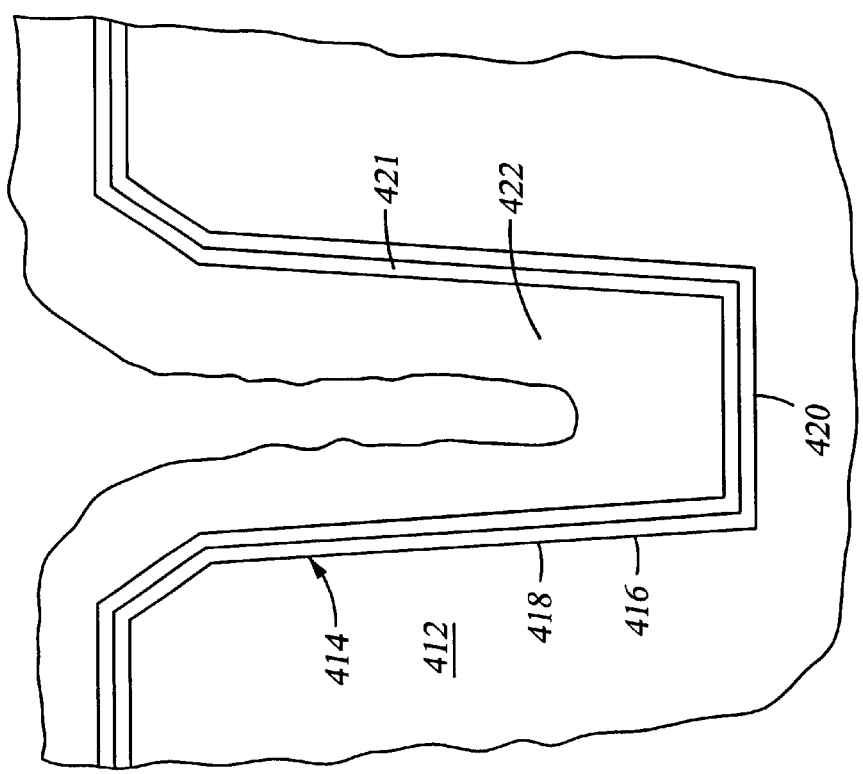
FIG. 4 is a schematic diagram of a metallized semiconductor substrate via according to the present invention having a metal seed layer deposited on a PVD adhesion layer which is deposited on a barrier layer.

Referring now to FIG. 4, a schematic diagram of one embodiment of the invention described herein with a substrate having a patterned dielectric layer 412 formed thereon is shown. The dielectric layer 412 has a via 414 having a high aspect ratio, i.e., a high ratio of via depth to via width, of about three (3), but the present invention may be beneficial in cooperation with vias having any aspect ratio.

A barrier layer 416 is deposited directly onto the substrate covering all surfaces or substantially all surfaces of the dielectric layer 412 including the walls 418 and floor 420 of via 414. The barrier layer 416 comprises titanium (Ti), titanium nitride (TiN), tantalum (Ta), tantalum nitride (TaN$_x$), tungsten (W), tungsten nitride (WN$_x$), and combinations thereof layer. Preferred barrier materials for copper metallization processes are Ta and TaN$_x$, which typically are deposited by a PVD process. PVD Ta and/or PVD TaN$_x$ are used for barrier layer 416. In the embodiment described herein, barrier layer 416 comprises tantalum. The barrier layer 416 is deposited to form a continuous or substantially continuous cap over the dielectric layer 412 and may be treated with nitrogen to improve barrier properties or adhesion to adjacent layers. Following deposition of the barrier layer 412, a post deposition step can be applied prior to deposition of adhesion or metal seed layers. Typically, chemical cleaning, plasma cleaning, and ion cleaning, can be used to modify barrier surfaces to enhance deposition of metal layers, such as copper, and reduce delamination.

An adhesion metal layer 421 is then deposited continuously over the barrier layer 416. Barrier layers can oxidize during deposition due to high temperatures, which can result in layers that have poor interface adhesion with subsequently deposited metal layers such as copper. An adhesion layer 421, usually a barrier material with good adhesion properties, is deposited to provide improved adhesion between the barrier layer 416 and subsequently deposited layers, such as metal seed layers or metal fill layers.

The adhesion layer 421 is deposited on the barrier layer comprises a material selected from a group of copper (Cu), platinum (Pt), gold (Au), nickel (Ni) molybdenum (Mo), and tungsten (W). Preferably, the adhesion layer comprises materials that do not oxidize easily. The adhesion metal layer is preferably copper for copper metallization processes. The adhesion layer is deposited by a PVD deposition technique, which includes ionized metal plasma (IMP) PVD, standard PVD, collimated PVD, or long-throw PVD techniques. The selected metals are deposited under PVD conditions that reduce oxidation to prevent agglomeration of the metal seed layer, caused by delamination from the barrier layer. Effective deposition of the adhesion layer under conditions that reduce oxidation to prevent agglomeration of the metal seed layer occurs when the substrate is cooled to less than about 450° C., preferably less than about 250° C., and most preferably at temperatures less than 0° C., such as by supplying a backside cooling gas to the substrate. Effective deposition can also occur when reduced power to generate a plasma is provided to the PVD chamber at a power level of less than about 10000 Watts, preferably between about 2500 watts and about 5000 watts. Effective deposition may also occur when the PVD chamber pressure is increased up to about 1 Torr to reduce ion bombardment, preferably at a chamber pressure between about 10 and about 60 milliTorr. The PVD process may occur in any suitable PVD chamber including ionized metal plasma (IMP) or collimated source chambers in addition to the longthrow and standard physical vapor deposition chambers as described above and shown in FIGS. 2 and 3. A conformal CVD or electro-chemical seed layer 422, preferably copper, is deposited on the adhesion metal layer 421 to a desired thickness not to exceed the thickness which would seal the top of the contact or via.

In one embodiment, the barrier layer 416 may also be deposited under conditions that reduce oxidation and prevent agglomeration. Under such conditions, the barrier layer 416 is deposited by delivering power to a PVD chamber at a power level of less than about 10000 watts, preferably between about 2500 watts and about 5000 watts, where the PVD chamber is maintained at pressure of less than about 1 Torr, preferably between about 10 milliTorr and about 60 milliTorr and the substrate is maintained at a temperature of less than about 450° C., preferably less than about 250° C., and most preferably at temperatures less than 0° C.

Figure 5:
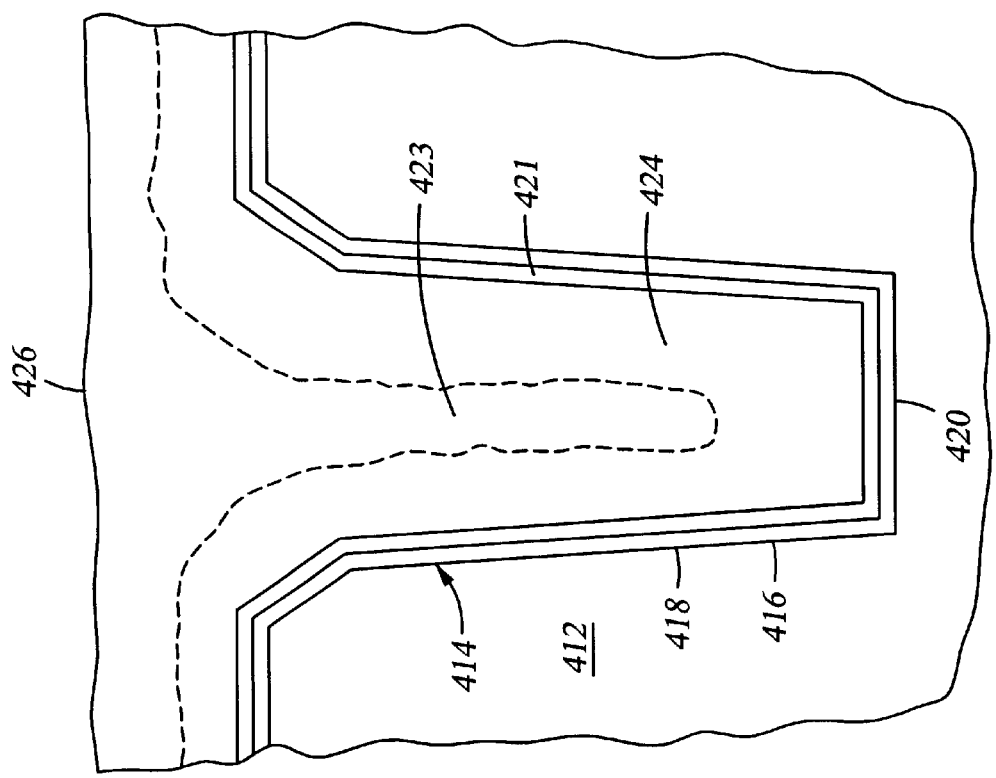
FIG. 5 is a schematic diagram of a metallized semiconductor substrate via according to the present invention having, a barrier layer, a PVD adhesion layer, and an intermixed metal seed layer and conducting metal layer filling the via.

Referring now to FIG. 5, the via 414 is filled by electro-chemical deposition of a metal layer 423, such as copper, deposited on the seed layer 422 of FIG. 4. A voidless fill 424 will result from electro-chemical deposition of a metal layer 423 onto the seed layer 422. After the fill of the feature, the top surface 426 of the fill 424 may be substantially planarized such as by chemical/mechanical polishing.

The deposition of layers with agglomeration described above is primarily dependent upon the temperature during deposition. High temperatures during deposition can cause oxidation of barrier and adhesion layers. Oxidation of these layers are believed to lead to dewetting of PVD and CVD copper and typically less than desirable interface properties which can result in low adhesion strength, electrical contacts, and microvoids. Control of the deposition temperature will result in better coverage of high aspect ratio features.

Primarily, the temperatures attained during deposition are associated with substrate heating during deposition, specifically by plasma heating, ion bombardment, and bias powers applied during the deposition process. The ion bombardment and the bias powers applied effect the kinetic energy of the depositing species, which is converted to heat after nucleation. Therefore, the temperature of the growing film can be controlled by varying the substrate temperatures, process pressures, the applied power to the target during PVD deposition, and also the applied bias power.

Accordingly, the invention described herein seeks to control the temperature of the deposition process. The PVD process chamber preferably contains a substrate pedestal cooling mechanism that will allow the substrate pedestal to be cooled to less than 0° C. Additionally, the substrate pedestal comprises a backside gas source connected to the pedestal providing a gas which flows around the substrate to provide a convective medium to cool the process gas during deposition of the adhesion layer. The cooling mechanisms allow for effective deposition of the adhesion layer occurs when the substrate is cooled to less than about 450° C., preferably less than about 250° C., and most preferably less than about 0° C. The deposition process operates with a process pressure as high as about 1 Torr, preferably between about 10 milliTorr and about 60 milliTorr. With higher pressure, the mean free path for collisions is decreased which results in reducing ion bombardment and lower temperatures.

The applied power to the deposition process is reduced from a typical operating power of less than about 10000 Watts, preferably between about 2500 Watts and about 5000 Watts during deposition. A lower applied power results in better step coverage as the collisions between the produced sputter species is reduced to provide a more vertical deposition. Finally, the PVD chamber may be a long throw PVD or similar chamber which allows greater distance between the substrate and substrate target to allow further cooling prior to deposition.

While foregoing is directed to the preferred embodiment of the present invention, other and further embodiments of the invention may be devised without departing from the basic scope thereof, and the scope thereof is determined by the claims that follow.

What is claimed is:

1. A method of controlling agglomeration on a substrate, comprising:

depositing a barrier layer on the substrate;

depositing an adhesion promoting layer on the barrier layer by physical vapor deposition while maintaining a substrate temperature of less than about room temperature, wherein the adhesion promoting layer is a metal selected from the group consisting of copper, platinum, gold, nickel, molybdenum, tungsten, and combinations thereof; and depositing a metal seed layer on the adhesion promoting layer.

2. The method of claim 1, wherein the adhesion promoting layer is deposited by physical vapor deposition at a power level of less than about 10,000 Watts.

3. The method of claim 2, wherein the adhesion promoting layer is deposited at a power level between about 2,500 Watts and about 5,000 Watts.

4. The method of claim 1, wherein the metal seed layer is deposited by chemical vapor deposition or electrochemical deposition.

5. The method of claim 1, wherein the metal seed layer comprises copper.

6. The method of claim 1, wherein the adhesion promoting layer is deposited by physical vapor deposition at a pressure of between about 10 milliTorr to about 60 milliTorr.

7. The method of claim 1, wherein the substrate temperature is between about −40° C. and about 0° C.

8. A method of controlling agglomeration during processing a substrate, comprising:

depositing a barrier layer on the substrate;

depositing an adhesion promoting layer on the barrier layer by physical vapor deposition at processing conditions that minimize agglomeration of the adhesion promoting layer, including depositing the adhesion promoting layer at a substrate temperature of less than about 0° C.; and depositing a metal seed layer on the adhesion promoting layer.

9. The method of claim 8, wherein the barrier layer is a metal selected from the group of titanium, titanium nitride, tantalum, tantalum nitride, tungsten, tungsten nitride, and combinations thereof.

10. The method of claim 8, wherein the barrier layer is deposited by sputtering a target in a physical vapor deposition chamber having a pressure of between about 10 milliTorr to about 60 milliTorr at a power level of between about 1,000 Watts and about 5,000 Watts and a substrate temperature of less than about 250° C.

11. The method of claim 8, wherein the adhesion promoting layer is deposited by physical vapor deposition at a power level of less than about 10,000 Watts.

12. The method of claim 8, wherein the adhesion promoting layer is deposited at a pressure of less than about 1 Torr.

13. The method of claim 8, wherein the adhesion promoting layer is a metal selected from the group consisting of copper, platinum, gold, nickel, molybdenum, tungsten, and combinations thereof.

14. The method of claim 8, wherein the adhesion promoting layer is deposited by sputtering a target in a physical vapor deposition chamber having a pressure of between about 10 milliTorr to about 60 milliTorr and at a power level of between about 1,000 Watts and about 5,000 Watts.

15. The method of claim 8, further comprising depositing a conducting metal layer on the metal seed layer.

16. The method of claim 15, wherein the metal seed layer comprises copper deposited by chemical vapor deposition or electrochemical deposition, and the conducting metal layer comprises copper and is deposited by an electroplating technique.

17. The method of processing a substrate, comprising:

depositing a barrier layer on the substrate;

depositing an adhesion promoting layer on the barrier layer by physical vapor deposition at processing conditions comprising a substrate temperature of less than about room temperature, at a pressure of between about 10 milliTorr to about 60 milliTorr, and at a power level of between about 1,000 Watts and about 5,000 Watts;

depositing a copper seed layer on the adhesion promoting layer by chemical vapor deposition or electrochemical deposition; and depositing a copper metal layer on the copper seed layer by an electroplating technique.

18. The method of claim 17, wherein the barrier layer is a metal selected from the group of titanium, titanium nitride, tantalum, tantalum nitride, tungsten, tungsten nitride, and combinations thereof.

19. The method of claim 17, wherein the barrier layer is deposited by sputtering a target in a physical vapor deposition chamber having a pressure of between about 10 milliTorr to about 60 milliTorr at a power level of between about 1,000 Watts and about 5,000 Watts and a substrate temperature of less than about 0° C.

20. The method of claim 17, wherein the adhesion promoting layer is a metal selected from the group consisting of copper, platinum, gold, nickel, molybdenum, tungsten, and combinations thereof.

21. A method of processing a substrate, comprising:

depositing a barrier layer material on the substrate to promote adhesion to the substrate while maintaining a substrate temperature of less than about room temperature, wherein the barrier layer material is selected from the group consisting of copper (Cu), platinum (Pt), gold (Au), nickel (Ni), molybdenum (Mo), and tungsten (W).

22. The method of claim 21, wherein the barrier layer material is deposited by physical vapor deposition.

23. The method of claim 21, wherein the barrier layer material is deposited at a power level of between about 2,500 Watts and about 5,000 Watts.

24. The method of claim 21, wherein the barrier layer material is deposited at a pressure of between about 10 milliTorr to about 60 milliTorr.

25. The method of claim 21, further comprising depositing a conductive metal layer on the barrier layer material.

26. The method of claim 25, wherein the conductive metal layer comprises copper.

27. A method of processing a substrate, comprising:

depositing an adhesion promoting layer on the substrate by physical vapor deposition while maintaining a substrate temperature of less than about room temperature, wherein the adhesion promoting layer is a metal selected from the group consisting of copper, platinum, gold, nickel, molybdenum, tungsten, and combinations thereof.

28. The method of claim 27, wherein the substrate temperature is between about −40° C. and about 0° C.

29. The method of claim 27, wherein the adhesion promoting layer is deposited at a power level between about 2,500 Watts and about 5,000 Watts.

30. The method of claim 27, wherein the adhesion promoting layer is deposited at a pressure of between about 10 milliTorr to about 60 milliTorr.

31. The method of claim 27, further comprises depositing a conductive metal layer on the adhesion promoting layer.

32. The method of claim 27, wherein the conductive metal layer comprises copper.

33. A method of processing a substrate, comprising:

depositing a barrier layer on the substrate; and depositing an adhesion promoting layer on the barrier layer while maintaining a substrate temperature of less than about room temperature, wherein the adhesion promoting layer is selected from the group consisting of copper (Cu), platinum (Pt), gold (Au), nickel (Ni), molybdenum (Mo), and tungsten (W).

34. The method of claim 33, wherein the adhesion promoting layer is deposited by physical vapor deposition.

35. The method of claim 33, wherein the adhesion promoting layer is deposited at a power level between about 2,500 Watts and about 5,000 Watts.

36. The method of claim 33, wherein the adhesion promoting layer is deposited at a pressure of between about 10 milliTorr to about 60 milliTorr.

37. The method of claim 33, further comprises depositing a metal seed layer on the adhesion promoting layer.

38. The method of claim 37, wherein the metal seed layer is deposited by chemical vapor deposition, physical vapor deposition, and electroplating.

39. The method of claim 37, wherein the metal seed layer is deposited by metal-organic chemical vapor deposition.

40. The method of claim 37, wherein the metal seed layer comprises copper.

41. The method of claim 33, further comprises depositing a conductive metal layer on the adhesion promoting layer.

42. The method of claim 41, wherein the conductive metal layer comprises copper.

\* \* \* \* \*